(12) United States Patent
Bilski et al.

(10) Patent No.: US 6,351,381 B1
(45) Date of Patent: Feb. 26, 2002

(54) HEAT MANAGEMENT SYSTEM

(75) Inventors: W. John Bilski, Mohnton; Matthew D. Nissley, Mt. Joy; Erik Mallett, Lancaster, all of PA (US)

(73) Assignee: Thermal Corp., Georgetown, DE (US)

( * ) Notice: Subject to any disclaimer, the term of this patent is extended or adjusted under 35 U.S.C. 154(b) by 0 days.

(21) Appl. No.: 09/885,470

(22) Filed: Jun. 20, 2001

(51) Int. Cl.[7] ................................................. H05K 7/20
(52) U.S. Cl. ........................ 361/695; 361/689; 361/690; 361/694; 361/696; 361/702; 361/704; 174/15.1; 174/16.1; 165/80.4; 165/104.33; 165/122; 454/184
(58) Field of Search ................................. 361/688, 687, 361/695–699, 700–704, 711, 715–722; 174/15.1, 15.2, 16.1, 16.3; 165/80.3, 80.4, 104.33, 122; 454/184

(56) References Cited

U.S. PATENT DOCUMENTS

| 2,522,365 A | 9/1950 | Greene ........................ 219/39 |
| 3,275,921 A | 9/1966 | Fellendorf et al. ............. 321/8 |

(List continued on next page.)

FOREIGN PATENT DOCUMENTS

| CH | 677293 | 4/1991 |
| EP | 0157370 | 10/1985 |
| GB | 758524 | 10/1956 |
| GB | 826625 | 1/1960 |
| GB | 2079655 | 1/1982 |
| JP | 56-137035 | 10/1981 |
| JP | 61-51861 | 3/1986 |
| JP | 63-221655 | 9/1988 |
| JP | 63-262861 | 10/1988 |
| JP | 1-286349 | 11/1989 |
| JP | 2-240951 | 9/1990 |
| JP | 3-142026 | 6/1991 |

OTHER PUBLICATIONS

HEATEX AB, Heat Exchanger, Model R, Oct. 22, 2001, Product data sheet and technical data, 5 World Wide Web pages , http://www.heatex.com/modelrht.html.

*Primary Examiner*—Leo P. Picard
*Assistant Examiner*—Boris L. Chervinsky
(74) *Attorney, Agent, or Firm*—Duane Morris LLP

(57) ABSTRACT

The present invention provides a heat management system for controlling the temperature inside of an electronics cabinet. A first heat exchanger is provided that includes a cold plate that is thermally interconnected with the electronic systems and components in the cabinet. A channel is defined in the cold plate that supports a tube having an entrance opening, an exit opening, and is arranged in thermal communication with the electronic systems so as to form a passageway for a liquid coolant fluid to travel through the channel. A second heat exchanger is provided that includes a condenser arranged in fluid flow communication with the entrance opening and the exit opening of the channel and a plurality of fans arranged in confronting relation to the condenser. A third heat exchanger is provided that includes two stacks of substantially parallel plates arranged in two-plate assemblies. Each two-plate assembly has a closed end and an open end such that a closed end of one two-plate assembly is sandwiched between an open end of two adjacent two-plate assemblies. Two fans are provided, one fan arranged so as to blow air onto a portion of the electronics and another fan arranged so as to draw heated air away from the electronics and blow the heated air into the open ends of the two-plate assemblies and the other fan arranged to circulate air from outside the cabinet through the third heat exchanger.

27 Claims, 9 Drawing Sheets

U.S. PATENT DOCUMENTS

| | | | |
|---|---|---|---|
| 3,643,131 A | 2/1972 | Scherbaum | 317/100 |
| 4,185,369 A | 1/1980 | Darrow et al. | 29/156.8 |
| 4,187,711 A | 2/1980 | Lavochkin et al. | 72/256 |
| 4,378,626 A | 4/1983 | Eitel | 29/527.2 |
| 4,508,163 A | 4/1985 | McCarthy | 165/80 |
| 4,509,839 A | 4/1985 | Lavochkin | 357/81 |
| 4,544,942 A | 10/1985 | McCarthy | 357/81 |
| 4,933,746 A | 6/1990 | King | 357/81 |
| 5,040,096 A | 8/1991 | Churchill et al. | 361/386 |
| 5,154,792 A | 10/1992 | Patterson | 156/307.3 |
| 5,454,428 A | 10/1995 | Pickard et al. | 165/49 |
| 5,655,381 A * | 8/1997 | Huttenlocher et al. | 62/259.2 |
| 5,829,516 A | 11/1998 | Lavochkin | 165/80.4 |
| 5,934,368 A * | 8/1999 | Tanaka et al. | 165/233 |
| 5,963,425 A * | 10/1999 | Chrysler et al. | 361/695 |
| 5,970,731 A * | 10/1999 | Hare et al. | 62/196.4 |
| 6,167,621 B1 | 1/2001 | Goth et al. | 29/890.054 |
| 6,173,759 B1 | 1/2001 | Galyon et al. | 165/80.4 |

* cited by examiner

HEAT MANAGEMENT SYSTEM

FIELD OF THE INVENTION

The present invention relates to an apparatus and system for improving heat management in an electronic system, and more particularly to a hybrid heat exchange system in which three heat exchange assemblies work in concert to manage the thermal profile of the electronic system.

BACKGROUND OF THE INVENTION

The performance of electronic systems is limited by temperature. Semiconductor device performance degrades when the internal temperature reaches or exceeds a particular limit. For example, in silicon integrated circuit devices, for each ten degree centigrade rise in junction temperature, the operating lifetime of the semiconductor device is decreased by a factor of at least two. Demands by OEMs for smaller package sizes and increased device densities has resulted in higher power densities, with the concomitant need for efficient heat dissipation becoming extremely important.

This industry need is further compounded in next generation, highly integrated semiconductor devices having relatively high thermal energy generation. Such devices are frequently found in present day and next generation communications equipment e.g., LPA amplifiers, radio based telephony, and other associated electronic systems. The manner of cooling these devices and systems has depended upon many parameters, including the space available for the cooling process, the temperatures to be encountered, the location(s) of high thermal output electronic components, and the ability to distribute or "spread" the thermal energy over sufficient surface area to provide for efficient heat transfer.

In the past, simply passing a fluid over the entire system or, over a finned heat sink that is attached to a portion of the system, was sufficient to maintain the electrical system at safe operating temperatures. Different cooling fluids have also been used, depending upon the application and the density of the electronic devices in a given system. However, different types of electronic systems require different cooling fluids, and different arrangements for circulating the fluids. These systems often have the highest heat removal rate for a limited area, but require considerably different amounts of power to operate, i.e. to be pumped to and from the heat transfer site, as well as requiring varying amounts of "real estate" in the electronic system. The foregoing problems are further exacerbated when the electronic system itself is subjected to significant fluctuations in ambient temperature. There is a need for a heat management system that provides varying degrees of heat transfer so as to be compatible with an electronic system having varying heat transfer requirements.

SUMMARY OF THE INVENTION

The present invention provides a heat management system for controlling the temperature inside of at least one cabinet containing a plurality of electronic systems and components. In a preferred embodiment of the invention, a first heat exchange assembly is provided that includes at least one cold plate that is thermally interconnected with at least one of the electronic systems and components. A channel is defined in the cold plate that supports a tube having an entrance opening, an exit opening, and is arranged to be in confronting relation to a portion of the electronic systems and components so as to form a passageway for a liquid coolant fluid to travel through the channel in thermal communication with the portion of the electronic systems and components. A second heat exchange assembly is provided that includes a condenser arranged in fluid flow communication with the entrance opening and the exit opening of the tube and a plurality of fans arranged in confronting relation to the condenser. A third heat exchange assembly is provided that includes at least one stack of substantially parallel plates arranged in two-plate assemblies. Each two-plate assembly has a closed end and an open end such that a closed end of one two-plate assembly is sandwiched between an open end of two adjacent two-plate assemblies. At least two fans are provided, with one fan arranged so as to: (i) blow air onto a portion of the plurality of electronic systems and components, (ii) draw heated air away from a portion of the plurality of electronic systems and components, and (iii) blow the heated air into the open ends of the two-plate assemblies. Another fan supplies cooler, ambient air to the adjacent two plate assembly to remove the heat and vent it outside of the cabinet through a side wall.

BRIEF DESCRIPTION OF THE DRAWINGS

These and other features and advantages of the present invention will be more fully disclosed in, or rendered obvious by, the following detailed description of the preferred embodiment of the invention, which is to be considered together with the accompanying drawings wherein like numbers refer to like parts and further wherein:

FIG. 6 is a cross-sectional view of a portion of the cold plate shown in FIGS. 4 and 5, as taken along line 6—6 in FIG. 5;

DETAILED DESCRIPTION OF THE PREFERRED EMBODIMENT

Figure 1:
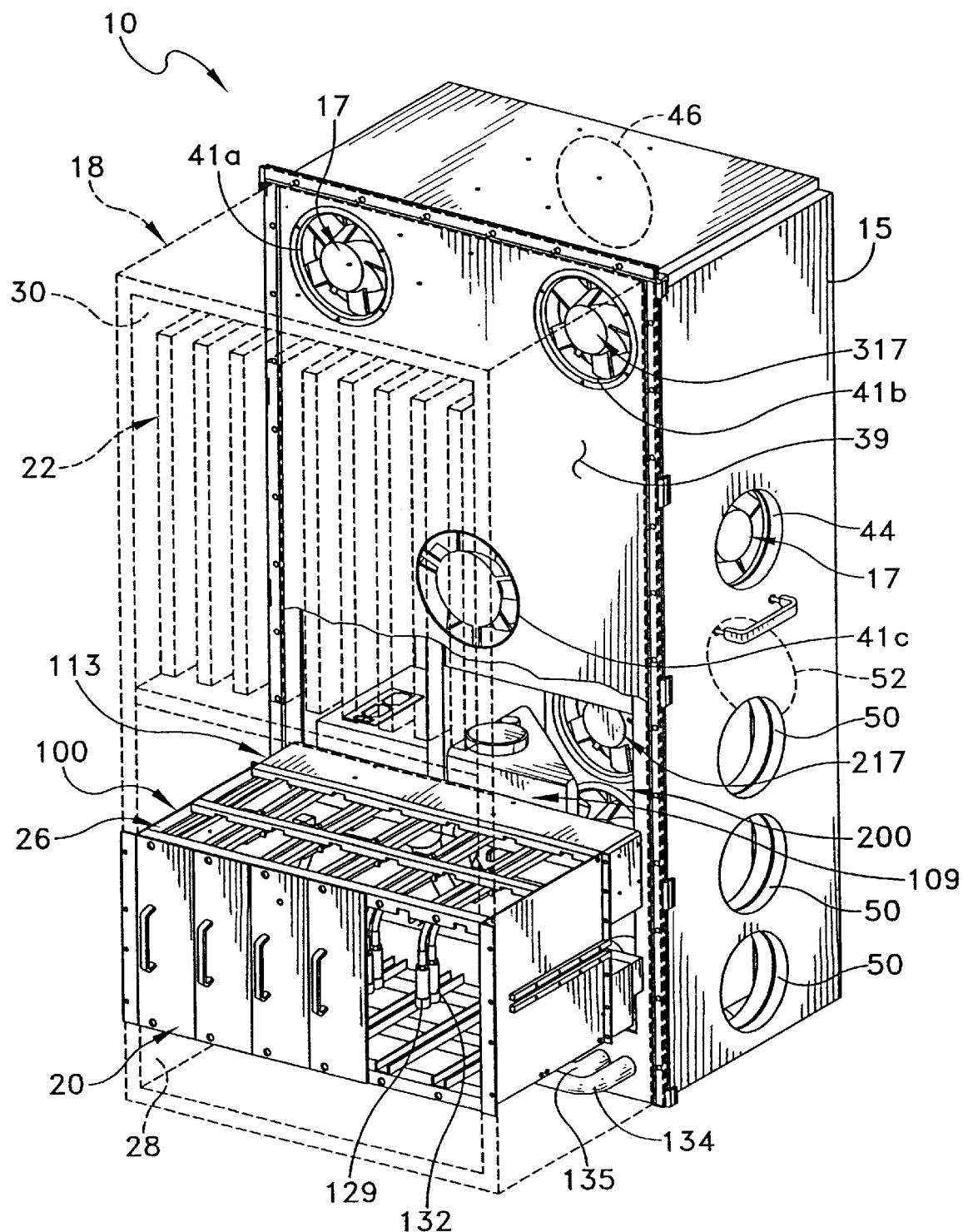
FIG. 1 is a perspective view, partially in phantom, of an electronics cabinet cooled by a heat management system formed in accordance with the present invention.

This description of preferred embodiments is intended to be read in connection with the accompanying drawings, which are to be considered part of the entire written description of this invention. In the description, relative terms such as "horizontal," "vertical," "up," "down," "top" and "bottom" as well as derivatives thereof (e.g., "horizontally," "downwardly," "upwardly," etc.) should be construed to refer to the orientation as then described or as shown in the drawing figure under discussion. These relative terms are for convenience of description and normally are not intended to require a particular orientation. Terms including "inwardly" versus "outwardly," "longitudinal" versus "lateral" and the like are to be interpreted relative to one another or relative to an axis of elongation, or an axis or center of rotation, as appropriate. The term "communication" refers to structures and actions that are connected to one another.

Figure 2:
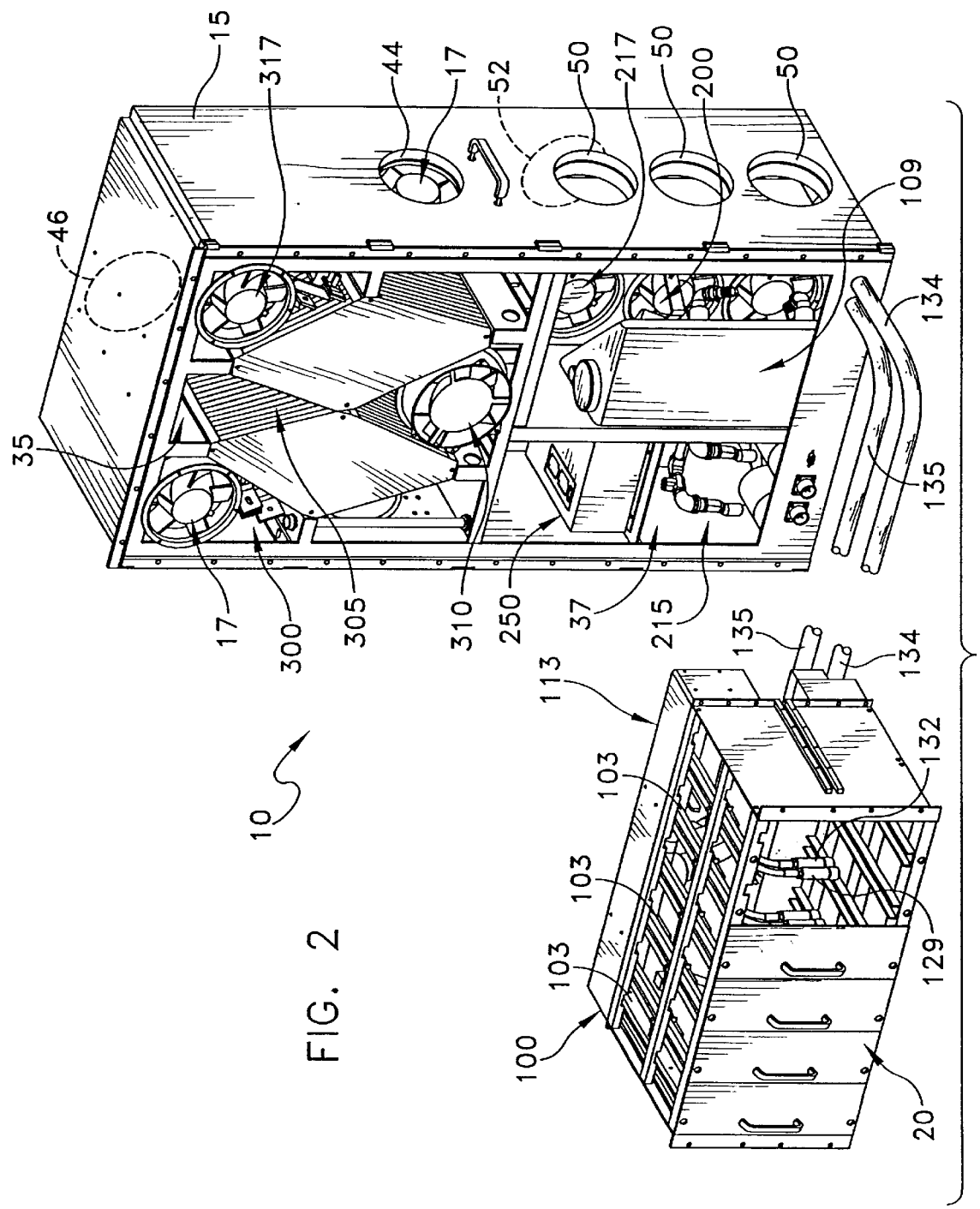
FIG. 2 is a perspective view of a heat management system formed in accordance with the present invention.
Figure 3:
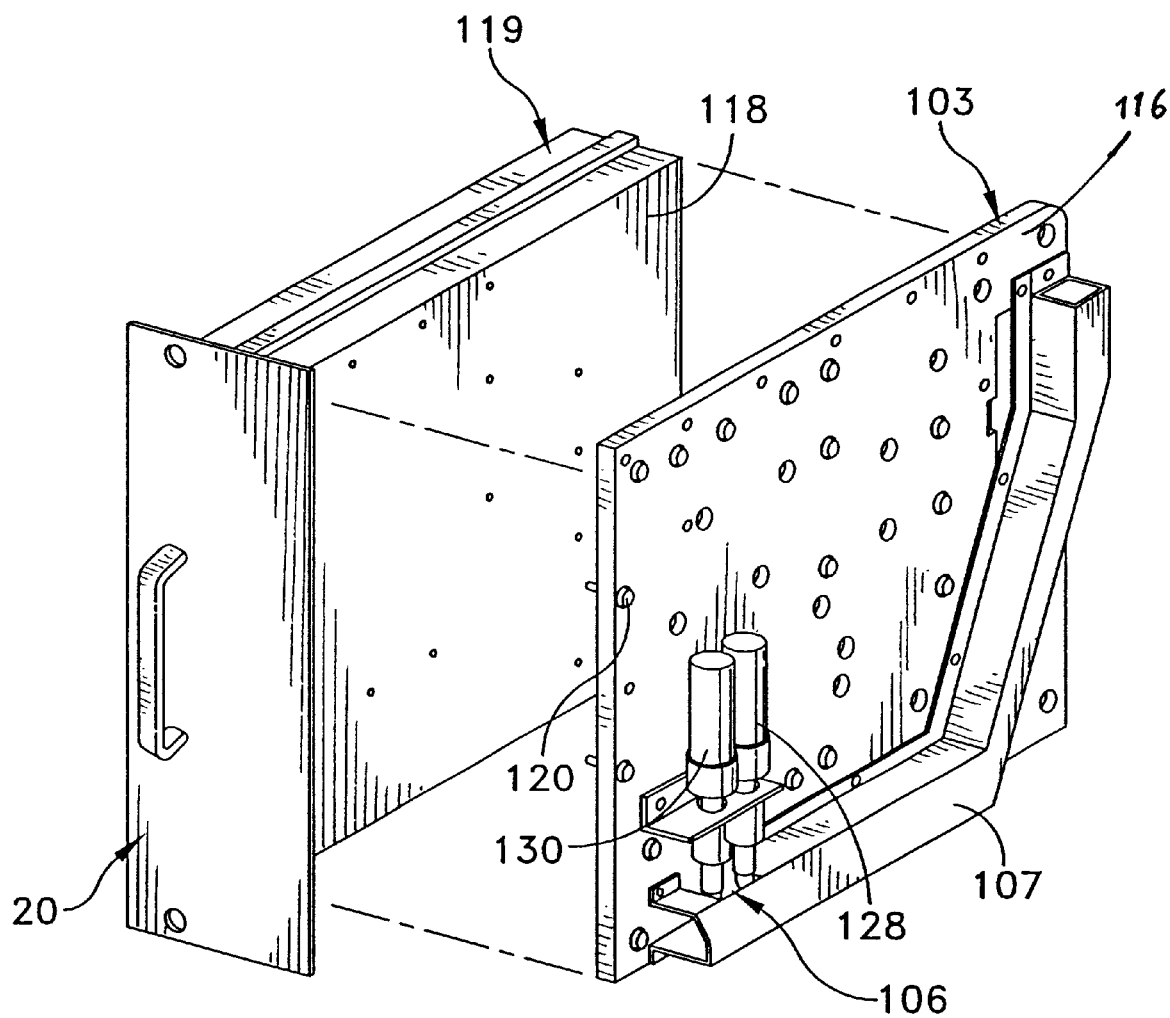
FIG. 3 is a perspective view of a portion of a primary heat exchange assembly showing a cold plate exploded away from a housing containing electronic systems to be cooled.

Referring to FIGS. 1 and 2, a thermal management system 10 formed in accordance with the present invention comprises a primary heat exchange assembly 100, a secondary heat exchange assembly 200, and a tertiary heat exchange assembly 300. Secondary and tertiary heat exchange assemblies 200 and 300 are housed in a first cabinet 15 which is attached to a portion of a second electronic systems cabinet 18, e.g., a CDMA systems cabinet (FIG. 1). Electronic systems cabinet 18 houses various heat generating electronic systems and devices, e.g., one or more LPA amplifiers and associated electronics modules 20 and one or more communications control systems and radio units 22. Several electronics modules 20 are supported in each of a plurality of racks 26 which are mounted, side-by-side, within a bottom portion 28 of electronic systems cabinet 18. Plurality of radio units 22 are mounted within a top portion 30 of electronic systems cabinet 18. As a result of this arrangement, during normal operation, plurality of electronics modules 20 and stacked communications control systems and radio units 22 will generate several thousand watts of thermal energy within electronic systems cabinet 18. For example, the present invention is adapted for operation in ambient temperatures ranging from −40° C. to +50° C. In these conditions, the invention will remove approximately 2,700 watts of thermal energy at a 15 degree centigrade temperature rise above ambient. The heat having been generated by the components associated with plurality of radio units 22 in cabinet 18, and also from natural convection of the electronics modules 20. There also may be an air heat load that is, for example, generated by solar radiation absorbed by cabinet 18.

Cabinets 15 and 18 comprise generally rectilinear structures that are arranged so as to thermally communicate with one another, via thermal management system 10. More particularly, cabinet 15 comprises an upper compartment 35 and a lower compartment 37 that house secondary and tertiary heat exchange assemblies 200 and 300, respectively. A hinged panel 39 operates to close-off both upper compartment 35 and lower compartment 37 (FIG. 1). Hinged panel 39 includes three openings 41a, 41b, and 41c in a top portion which allow for the only fluid communication between the interior of upper compartment 35 of cabinet 15 and top portion 30 of electronic systems cabinet 18. The walls of cabinet 15 that bound upper compartment 35 include side wall openings 44 and a rear wall opening 46. Lower compartment 37 is sized and shaped to house secondary heat exchange assembly 200. A plurality of openings 50 are defined through the side walls of cabinet 15 so as to provide for flow communication of air into lower compartment 37 and rear wall opening 52 provides for flow communication of air out of lower compartment 37. The compartments of cabinet 15 are typically sealed by welding or application of a sealant to maintain separation between them and the ambient environment. In this way, cabinet 15 is sufficiently sealed against dust, water, etc., so as to meet NEMA 4 and NEMA 12 standards. All sealants, gaskets, etc., are selected so as to be compatible with Underwriter Laboratories standard 94, rating V-1 or V-0.

Referring to FIGS. 1–7, primary heat exchange assembly 100 is positioned within bottom portion 28 of electronic systems cabinet 18, and includes a plurality of cold plates 103, a plurality of tubes 104, a plurality of coolant transport conduits 106. More particularly, each cold plate 103 is formed from a flat planar sheet of thermally conductive material, such as copper, aluminum, steel or the like. A wall 118 of housing 119 (that supports electronic components and circuits, e.g., an LPA amplifier) is fastened to a bottom surface 115 of each cold plate 103, and a flat cover sheet 116 is fastened to surface 117, via plurality of fasteners 120, so as to be in close thermal communication with cold plate 103 and tube 104. Fasteners 120 extend transversely through cold plate 103.

Figure 4:
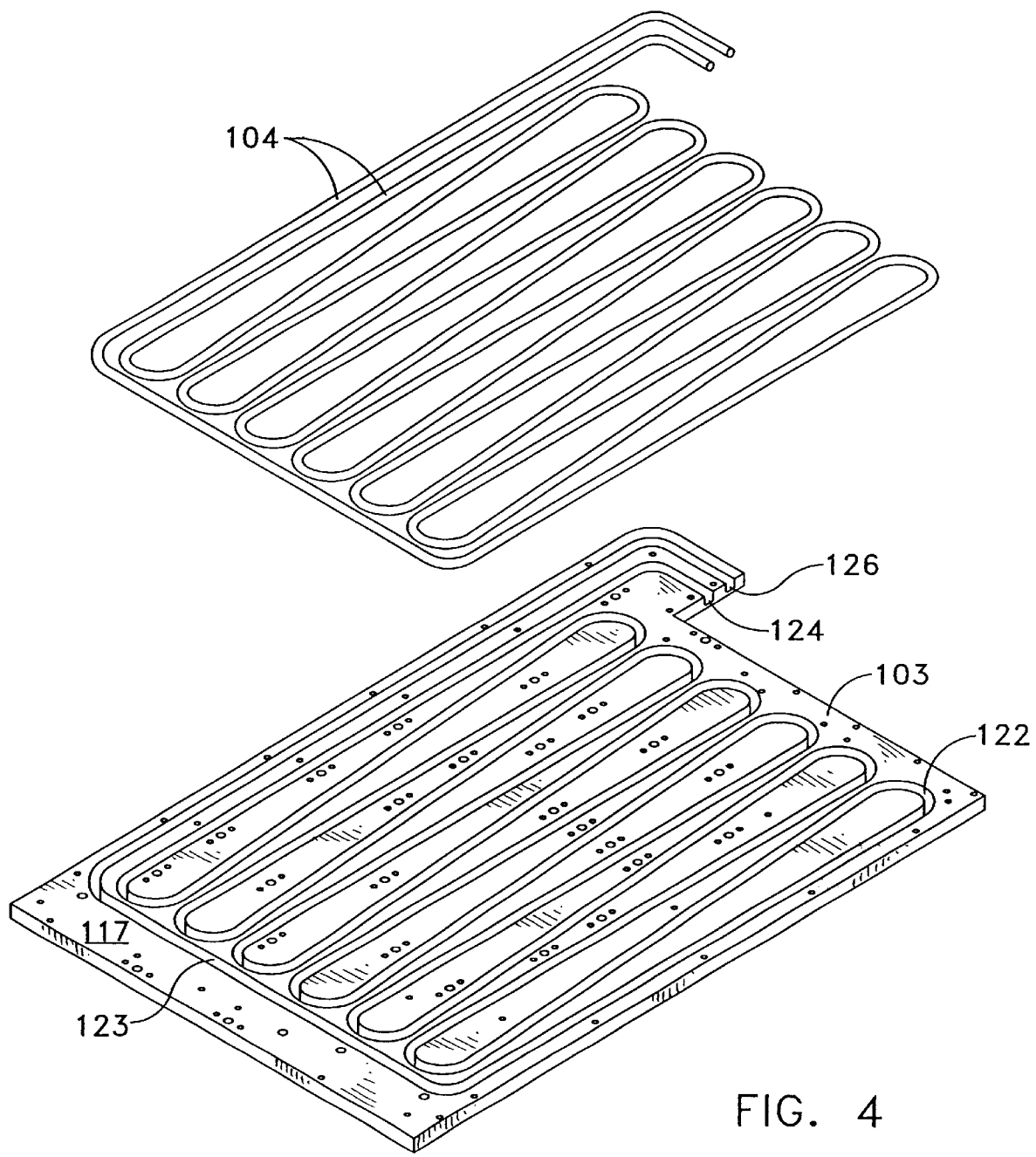
FIG. 4 is a perspective view of a cold plate.
Figure 5:
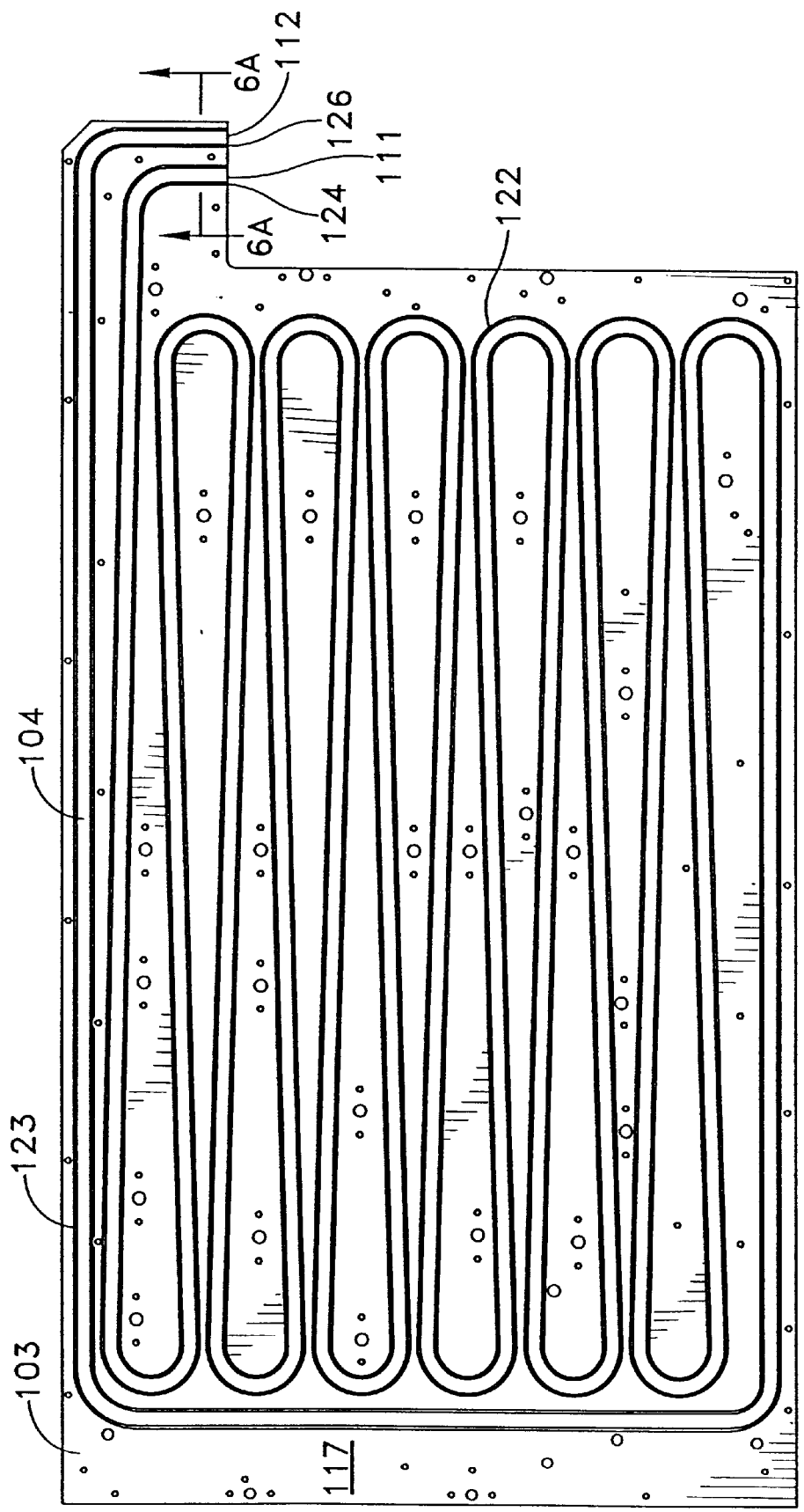
FIG. 5 is a plan view of the cold plate shown in FIG. 4.

Each cold plate 103 includes a channel having a heat absorbing section 122 and a heat transporting section 123 extending through surface 117 and into the interior of the plate. Heat absorbing section 122 and heat transporting section 123 often have a rectilinear cross-section, but other cross-sectional shapes, i.e., oval, round, polygonal, may also be used with good effect. Heat absorbing section 122 cuts a serpentine path through surface 117 of cold plate 103, and a heat transporting section 123 cuts a path through surface 117 that is peripheral to, and partially circumscribes, heat absorbing section 122 (FIGS. 4 and 5). Heat absorbing section 122 has a width or diameter, and depth that is smaller than the width or diameter and depth of heat transporting section 123. Of course, various other shapes and arrangements may be employed for heat absorbing section 122, e.g. zig-zag, spiral, etc., without departing from the scope of the present invention. Heat absorbing section 122 and heat transporting section 123 are continuous throughout the interior of cold plate 103, with heat absorbing section 122 defining an entrance port 124, and heat transporting section 123 defining an exit port 126 at one end of cold plate 103.

Figure 6A:
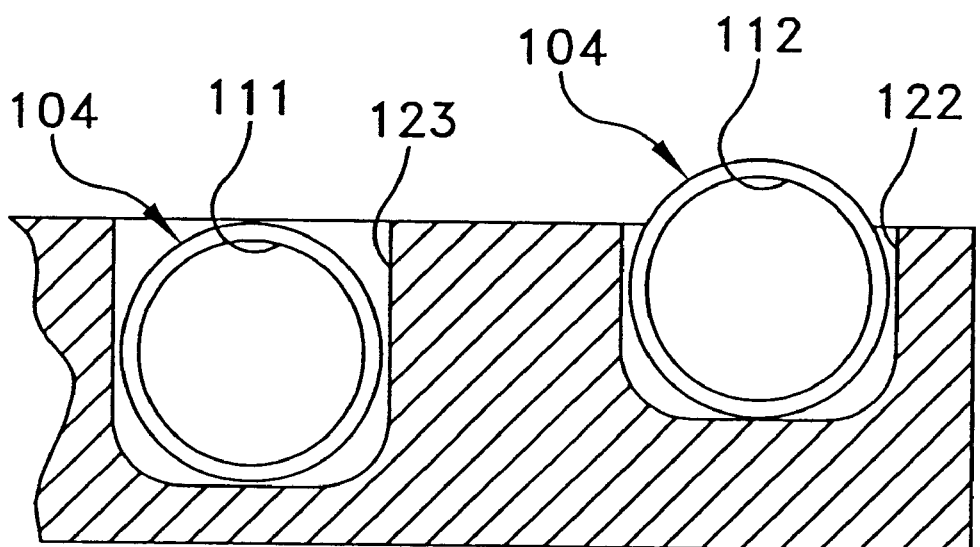
FIG. 6a is a cross-sectional view of a portion of the cold plate shown in FIGS. 4 and 5, as taken along line 6a—6a in FIG. 5, showing a tube positioned within a channel in the cold plate prior to press-fitting.
Figure 6B:
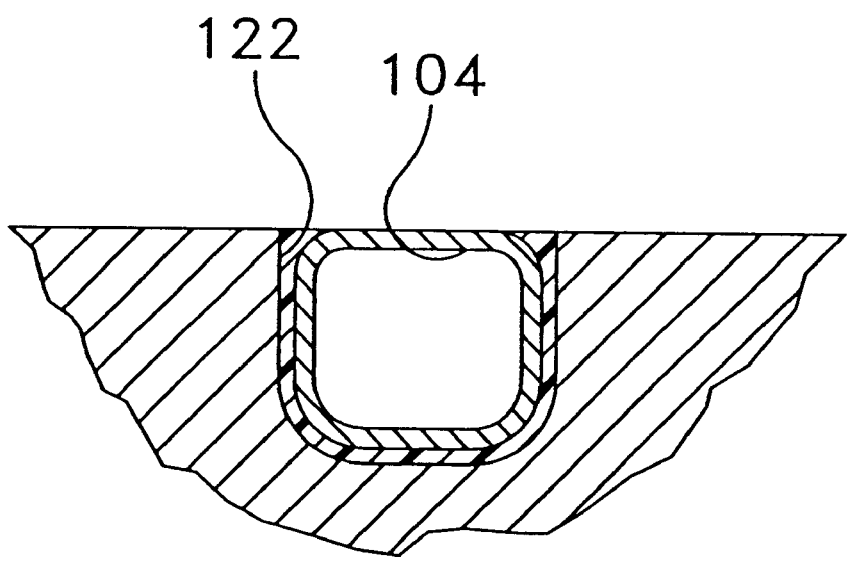
FIG. 6b is a cross-sectional view of a portion of the cold plate shown in FIGS. 4 and 5, as taken along line 6b—6b in FIG. 5, showing the tube positioned within the channel in the cold plate after press-fitting.

Each tube 104 has a first open end 111 and a second open end 112, and is preferably formed from a cylinder of malleable and thermally conductive metal, such as copper, aluminum, or the like so as to be compatible with a press-fitting operation during assembly of tube 104 to cold plate 103. Tube 104 has an outer diameter that approximately corresponds to the width of, and is larger than the depth of, heat absorbing section 122. When positioned within heat absorbing section 122, a portion of tube 104 preferably stands proud of surface 117. During press-fitting, the top portion of tube 104, that stands proud of surface 117, is plastically deformed so as to be substantially flush with surface 117 (FIGS. 6a and 6b). This causes the remainder of tube 104 to plastically flow into a shape that more closely corresponds to the cross-sectional shape of the channel. In this way, tube 104 may be securely press-fit into heat absorbing section 122, and maintained in close thermal communication with cold plate 103 by the inclusion of a thermally conductive epoxy or the like in the bottom of the channel. This construction allows for maximum heat transfer between cold plate 103, tube 104 and coolant fluid 127 (e.g., an effective mixture of propylene glycol and water or the like, FIG. 7).

Since heat transporting section 123 has a larger width or diameter than heat absorbing section 122, it also has a larger width or diameter than tube 104. Thus only substantially line contact is made between the outer surface of tube 104 and the walls of heat transporting section 123. Tube 104 is not press-fit into heat transporting section 123, but a small amount of non-thermally conductive epoxy may be used to maintain tube 104 within heat transporting section 123. This construction allows for minimum heat transfer between the portion of coolant fluid 127 that has been heated during its pass through the serpentine portion of heat absorbing section 122, and cold plate 103, or the cooler portions of coolant 127 that are entering heat absorbing section 122.

Thus, coolant fluid 127 may be pumped into open end 111 of tube 104 located at entrance port 124 where it circulates throughout the interior of cold plate 103, tube 104, and emerges from open end 112 located at exit port 126. The serpentine shape of heat absorbing section 122 and tube 104 causes coolant fluid 127 flowing through it to be dispersed across a substantial portion of cold plate 103, and therethrough to wall 118 of electronics module housing 119 so as to achieve efficient and thorough heat transfer from the enclosed LPA amplifiers or other electronics devices to cold plate 103 and coolant fluid 127.

A pair of coolant transport conduits 106 are positioned on the outer surface of each cold plate 103, on the side opposite to the channel, and are shielded by a cover 107. One conduit 106 is connected to open end 111 of tube 104 at entrance port 124 and one conduit 106 is connected to open end 112 of tube 104 at exit port 126. Coolant fluid ports 128,130 are each disposed at an open end of a coolant transport conduit 106, and are sized and shaped to sealingly interconnect with a distribution manifold 113, via connectors 129,132, and therethrough to hoses 134,135 that together guide the circulation of coolant fluid 127 between tubes 104 in each of cold plates 103 and coolant reservoir 109. Typically, the heat removed by primary heat exchange assembly 100 is approximately 4,500 watts, with cold plates 103 maintaining 80° C. at the outer surface of each electronics module housing, and with the entire system operating at +50° C. ambient temperature.

Figure 7:
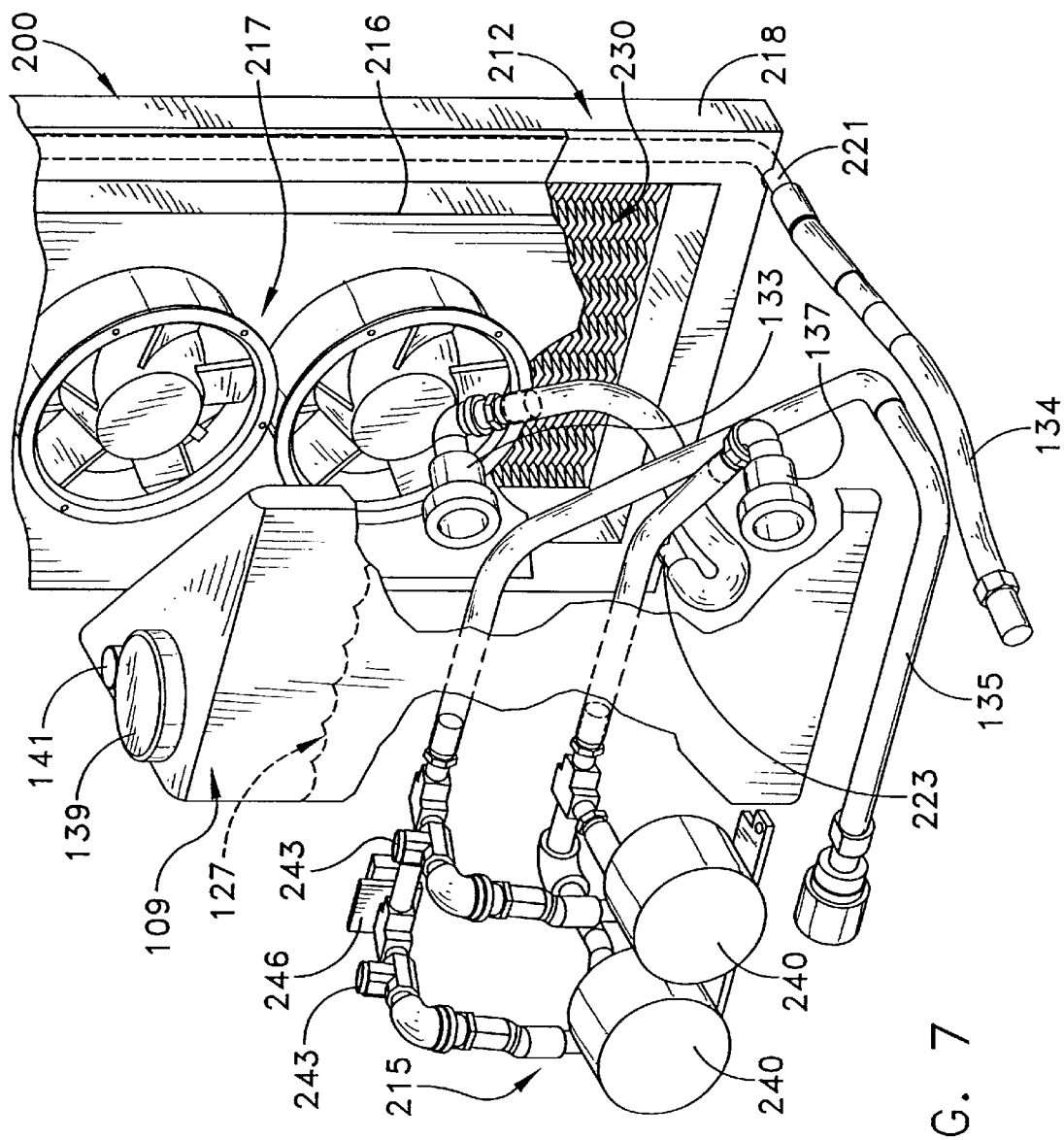
FIG. 7 is an exploded and partially broken-away perspective view of a secondary heat exchange assembly formed in accordance with the present invention.

Referring to FIGS. 1, 2, and 7, a coolant reservoir 109 is normally positioned within lower compartment 37 of cabinet 15. Coolant reservoir 109 comprises a tank including an inlet port 133, an outlet port 137 and a vented lid 139. A float gauge 141 may be positioned within coolant reservoir 109 to allow for monitoring of the coolant fluid level (not shown). In a preferred embodiment, coolant reservoir 109 comprises a triangular cross-sectional shape, and holds about twelve liters of coolant 127. Coolant reservoir 109 may also include a thermocouple for monitoring coolant temperature.

Secondary heat exchange assembly 200 includes a liquid-to-air heat exchanger 212, a pumping system 215, and a plurality of fans 217. Liquid-to-air heat exchanger 212 is positioned adjacent to an interior facing wall of coolant reservoir 109. Liquid-to-air heat exchanger 212 includes a generally rectangular frame 218, an input port 221 and an output port 223 that are typically located on a bottom edge of frame 218. Plurality of fans 217 are mounted to a supporting bracket 216 located on a side surface of frame 218 of liquid-to-air heat exchanger 212 so as to be positioned adjacent to the interior wall of coolant reservoir 109.

Figure 8:
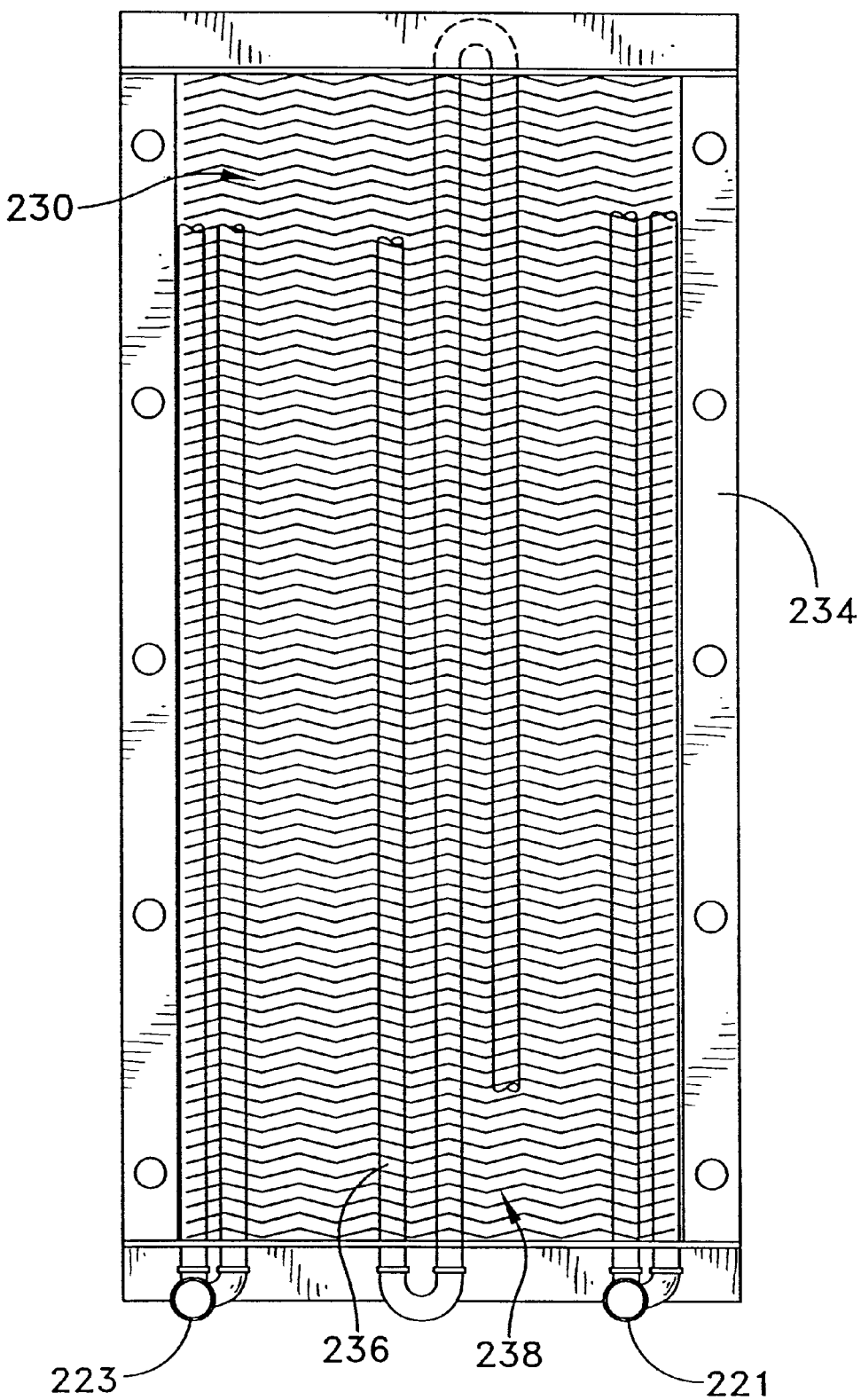
FIG. 8 is a plan view of a condenser used in connection with the secondary heat exchange assembly.

Liquid-to-air heat exchanger 212 includes a condenser 230 comprising a frame-mount 234 that supports a serpentine tube 236 that traverses the interior portions of a fin stack 238 (FIGS. 7 and 8). Frame-mount 234 is fastened to a side surface of frame 218 in spaced confronting relation to plurality of fans 217. In this way, coolant liquid 127 from plurality of cold plates 103 may be circulated through condenser 230 so as to be cooled by plurality of fans 217.

Outside ambient air is drawn into lower compartment 37 via side wall openings 50, and the exhaust from fans 217 is directed out of cabinet 15 via rear wall opening 52. In this way, heated coolant fluid 127 from plurality of cold plates 103 is cooled prior to being deposited in coolant reservoir 109, via inlet port 133, and the exhaust heat is transferred from cabinet 15 in an air stream moving outwardly through rear wall opening 52.

Referring to FIGS. 2 and 7, pumping system 215 includes two pumps 240, check valves 243, and pressure switch 246. Any of the well known pumps, valves and pressure switches may be used in constructing pump system 215 with adequate results. Pumping system 215 is arranged and interconnected between coolant reservoir 109 and plurality of cold plates 103 so as to draw cooled coolant fluid 127 from coolant reservoir 109 and return it to each of cold plates 103 in a circulatory fashion. In this arrangement, only one of the two pumps 240 is running at any given time during the operation of primary and secondary heat exchange assemblies 100 and 200. Pressure switch 246 is adapted as a monitor for the system pressure to determine whether at least one pump is operating. If at least one pump is not running, the second pump may be switched on so as to prevent a failure of the system.

A programmable controller 250 (FIG. 2) or other known control system is employed to control and operate pumping system 215 and plurality of fans 217. More particularly, programmable controller 250 is electrically interconnected to pumping system 215 and plurality of fans 217, and may be selected from any of the well known prior art programmable controllers capable of continuous use at ambient temperatures of approximately −40° C. to +65° C. It will be understood that other types of programmable devices may be used in connection with the present invention as equivalents to the foregoing programmable controller, such as, a general purpose computer, a personal computer, a specially designed computer or equivalent electronic circuit capable of functioning in substantially the same way, with substantially the same result, as the foregoing programmable controller, or the like programmable means. It will also be understood that an appropriate power supply interconnected to a source of electrical energy is required to operate the programmable controller or equivalent means, switches, sensors, valves, pumps and each will be an obvious design choice for those skilled in the art.

Figure 9:
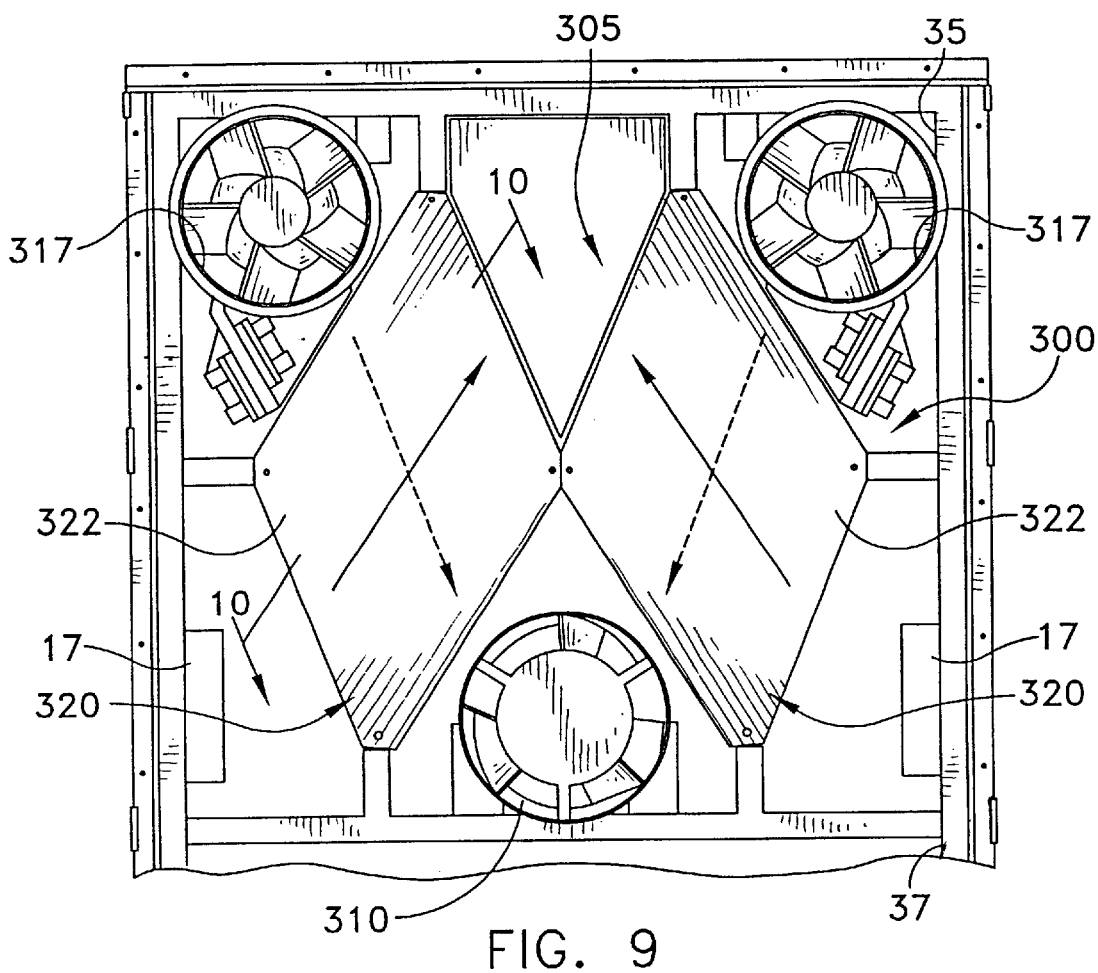
FIG. 9 is a plan view of a tertiary heat exchange assembly formed in accordance with the present invention.
Figure 10:
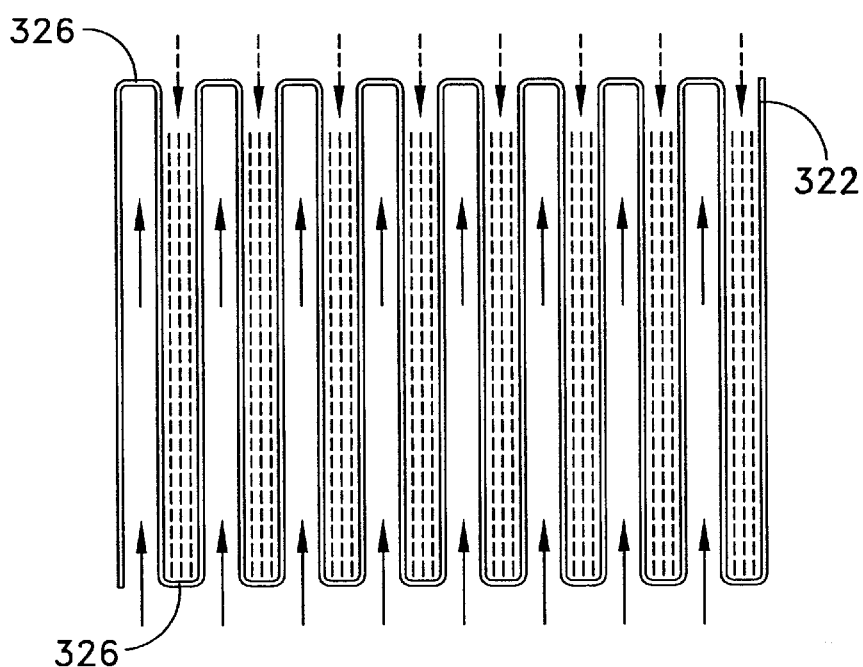
FIG. 10 is a sectional view of an air-to-air heat exchanger, as taken along lines 10—10 in FIG. 9.

Referring to FIGS. 2 and 9, tertiary heat exchange assembly 300 is located within upper compartment 35 of cabinet 15 in air-flow isolation from lower compartment 37 and secondary heat exchange assembly 200. Tertiary heat exchange assembly 300 includes air-to-air heat exchanger 305, blower fan 310, and intake fans 317. More particularly, air-to-air heat exchanger 305 comprises two stacks 320, each having a plurality of substantially parallel, spaced-apart plates 322 that are supported within upper compartment 35 of cabinet 15. Each plate 322 has a generally flat, rectilinear shape, with a diamond shape being preferred in one application. Each of plates 322 may be formed from a single sheet of metal or other good thermal conductor, and includes means defined along at least two parallel opposing edges for joining adjacent plates to one another so as to form two-plate assemblies 326. By rotating one plate relative to its mate in each of the two-plate assemblies, two independent airflow paths may be created through stacks 320. An air-to-air heat exchanger 305 that has been found to provide adequate results in connection with the present invention is the one manufactured by the HEATEX AB company of Tommarpsvägen 46, SE-231 65 Trelleborg, Sweden, and designated Model RH (Rhombical).

Thus, a first two-plate assembly allows air to flow between its plates, but not to enter further into the interior of cabinet 15. Likewise, a second adjacent two-plate assembly allows air to flow between its plates, but not to exit the interior of cabinet 15. As a result, outside ambient air is circulated through air-to-air heat exchanger 305 by fans 17 located in side wall openings 44, while air from the interior of cabinet 15 is circulated through air-to-air heat exchanger 305 via fans 317 located in openings 41a and 41b of wall 39, and reintroduced into electronics cabinet 18 via blower 310 located in opening 41c. This arrangement prevents the exchange of outside ambient air with air disposed within the lower compartment 37 of cabinet 15. Tertiary heat exchange assembly 300 operates in such a way that a maximum 15° C. temperature rise inside the enclosure is experienced during a +50° C. ambient temperature.

It is to be understood that the present invention is by no means limited only to the particular constructions herein disclosed and shown in the drawings, but also comprises any modifications or equivalents within the scope of the claims.

What is claimed is:

1. A heat management system for controlling the temperature inside of a cabinet containing a plurality of electronic systems and components comprising:

a first heat exchanger including at least one cold plate that is thermally interconnected with at least one of said electronic systems and components, a channel defined in said cold plate supporting a tube having an entrance opening, an exit opening and arranged to be in confronting relation to a portion of said electronic systems and components so as to form a passageway for a liquid coolant fluid to travel through said tube in thermal communication with said portion of said electronic systems and components;

a second heat exchanger including a condenser arranged in fluid flow communication with said entrance opening and said exit opening of said tube and a plurality of fans arranged in confronting relation to said condenser; and a third heat exchanger including at least one stack of substantially parallel plates arranged in two-plate assemblies wherein each two-plate assembly has a closed edge and an open edge such that a closed edge of one two-plate assembly is sandwiched between an open edge of two adjacent two-plate assemblies and at least two fans, one fan arranged so as to (i) blow air onto a portion of said plurality of electronic systems and components (ii) draw heated air away from said portion of said plurality of electronic systems and components and (iii) blow said heated air into said open ends of said two-plate assemblies; and one fan arranged so as to circulate air from the environment surrounding said heat management system through said third heat exchanger.

2. A heat management system according to claim 1 wherein said system comprises a plurality of cold plates, each one thermally interconnected with a separate one of said electronic systems and components.

3. A heat management system according to claim 2 wherein said plurality of cold plates are interconnected with a coolant reservoir via a plurality of coolant transport conduits.

4. A heat management system according to claim 1 wherein said at least one cold plate is formed from a flat planar sheet of thermally conductive material comprising a channel including a heat absorbing section and a heat transporting section wherein said heat absorbing section cuts a serpentine path through a surface of said cold plate and said heat transporting section cuts a path through said surface that is peripheral to said heat absorbing section.

5. A heat management system according to claim 1 wherein said tube is serpentine having an entrance opening and an exit opening, and wherein said tube extends continuously through said plate so that a coolant fluid that is pumped into said entrance opening circulates throughout the interior of said cold plate and emerges from said exit opening.

6. A heat management system according to claim 5 wherein said serpentine tube causes said flowing coolant fluid to be dispersed across a substantial portion of a housing supporting said electronic systems and components so as to achieve efficient and thorough heat transfer from said plurality of electronic systems and components to said at least one cold plate and said coolant fluid.

7. A heat management system according to claim 3 wherein said plurality of coolant transport conduits are positioned on an outer surface of each of said cold plates on a side opposite to said plurality of electronic systems and components and are shielded by a cover.

8. A heat management system according to claim 7 wherein one of said coolant transport conduits is connected to said entrance opening and one of said coolant transport conduits is connected to said exit opening.

9. A heat management system according to claim 8 wherein said coolant transport conduits include coolant fluid ports that are disposed at an open end and sized and shaped to sealingly interconnect with a distribution manifold that guides the circulation of said coolant fluid between each of said at least one cold plates and a coolant reservoir.

10. A heat management system according to claim 8 wherein said first heat exchanger removes at least 4,500 watts and said at least one cold plate maintains 80° C. at an outer surface of a housing supporting said plurality of electronic systems and components, with the entire system operating at +50° C. ambient temperature.

11. A heat management system according to claim 1 comprising a coolant fluid reservoir interconnected between said first heat exchanger and said second heat exchanger in flow communication and comprising a tank including an inlet port, an outlet port and a lid, and including a float gauge positioned to allow for monitoring of a coolant fluid level wherein said coolant reservoir comprises a triangular cross-sectional shape.

12. A heat management system according to claim 4 wherein said heat absorbing section has a width and depth that is smaller than a width and a depth of said heat transporting section.

13. A heat management system according to claim 12 wherein said tube has an outer diameter that corresponds to said width and is larger than said depth of said heat absorbing section so that said tube may be securely press-fit into said heat absorbing section and be maintained therein in close thermal communication with said cold plate so as to allow for maximum heat transfer between said cold plate and said tube.

14. A heat management system according to claim 12 wherein said heat transporting section has a larger width and depth than said tube such that minimal thermal contact is made between said tube and the portion of said cold plate defining said heat transporting section thereby allowing for minimum heat transfer.

15. A heat management system for controlling the temperature inside of a cabinet containing a plurality of electronic systems and components comprising:

a first heat exchanger that is thermally interconnected with at least one of said electronic systems and components including a conduit having an entrance, an exit and arranged to be in confronting relation to a portion of a housing supporting a portion of said plurality of electronic systems and components so as to form a passageway for a liquid coolant fluid to travel through said conduit in thermal communication with said portion of said housing;

a second heat exchanger including a condenser arranged in fluid flow communication with said entrance and said exit of said channel and a plurality of fans arranged in confronting relation to said condenser; and a third heat exchanger including at least one stack of substantially parallel plates arranged in two-plate assemblies wherein each two-plate assembly has a closed edge and an open edge such that a closed edge of one two-plate assembly is sandwiched between an open edge of two adjacent two-plate assemblies and at least two fans, one fan arranged so as to (i) blow air onto a portion of said plurality of electronic systems and components (ii) draw heated air away from said portion of said plurality of electronic systems and components and (iii) blow said heated air into said open ends of said two-plate assemblies; and one fan arranged so as to circulate air from the environment surrounding said heat management system through said third heat exchanger.

16. A heat management system according to claim 15 wherein said condenser comprises a frame that supports a serpentine tube that traverses the interior portions of a fin stack with said fin stack and said serpentine tube being arranged in spaced confronting relation to a plurality of fans.

17. A heat management system according to claim 15 wherein said second heat exchanger includes a pumping system and a plurality of fans and is positioned adjacent to an interior facing wall of a coolant reservoir that is in flow communication with said conduit.

18. A heat management system according to claim 17 wherein said plurality of fans are mounted to a supporting bracket located on a side surface of said frame so as to be positioned adjacent to the interior wall of said coolant reservoir.

19. A heat management system according to claim 18 wherein said liquid coolant fluid travels through said condenser so as to be cooled by said plurality of fans.

20. A heat management system according to claim 15 wherein ambient air is drawn into a lower compartment of said cabinet by at least one air exchange fan and heated exhaust air is directed out of said cabinet.

21. A heat management system according to claim 17 wherein heated coolant fluid from said conduit is cooled within said condenser prior to being deposited in said coolant reservoir.

22. A heat management system according to claim 17 wherein said pumping system includes two pumps, at least two check valves, and a pressure switch and is arranged and interconnected between said coolant reservoir and said conduit so as to circulate cooled coolant fluid between said coolant reservoir and said conduit entrance.

23. A heat management system according to claim 22 wherein only one of said two pumps is operating during the operation of said heat management system and said pressure switch monitors the system pressure to determine whether at least one pump is operating.

24. A heat management system for controlling the temperature inside of a cabinet containing a plurality of electronic systems and components comprising:

a first heat exchanger that is thermally interconnected with at least one of said electronic systems and components including a cold plate comprising a serpentine conduit having an entrance port, an exit port and arranged to be in confronting relation to a wall of a housing supporting a portion of said plurality of electronic systems and components so as to form a passageway for a liquid coolant fluid to travel through said cold plate in thermal communication with said wall of said housing;

a second heat exchanger including a condenser arranged in fluid flow communication with said entrance port and said exit port of said cold plate and a plurality of fans arranged in confronting relation to said condenser; and a third heat exchanger including at least one stack of substantially parallel plates arranged in two-plate assemblies wherein each two-plate assembly has a closed edge and an open edge such that a closed edge of one two-plate assembly is sandwiched between an open edge of two adjacent two-plate assemblies and at least two fans, one fan arranged so as to (i) blow air onto a portion of said plurality of electronic systems and components (ii) draw heated air away from said-portion of said plurality of electronic systems and components and (iii) blow said heated air into said open ends of said two-plate assemblies; and one fan arranged so as to circulate air from the environment surrounding said heat management system through said third heat exchanger.

25. A heat management system according to claim 24 wherein said third heat exchanger is located within an upper compartment of said cabinet in air-flow isolation from a lower compartment containing said second heat exchanger.

26. A heat management system according to claim 24 wherein said plates are generally flat and are formed from a single sheet of metal that comprises means for joining adjacent plates to form said two-plate assemblies.

27. A heat management system according to claim 24 wherein a first two-plate assembly allows heated air to circulate between its plates and a second adjacenttwo-plate assembly allows ambient air to circulate between its plates, so that ambient air is circulated through said third heat exchanger and air from the interior of said cabinet is circulated through said third heat exchanger without exchange of ambient air with interior air.

* * * * *